(12) United States Patent
Minich

(10) Patent No.: US 7,749,009 B2
(45) Date of Patent: *Jul. 6, 2010

(54) SURFACE-MOUNT CONNECTOR

(75) Inventor: Steven E Minich, York, PA (US)

(73) Assignee: FCI Americas Technology, Inc., Carson City, NV (US)

(*) Notice: Subject to any disclaimer, the term of this patent is extended or adjusted under 35 U.S.C. 154(b) by 0 days.

This patent is subject to a terminal disclaimer.

(21) Appl. No.: 12/119,233

(22) Filed: May 12, 2008

(65) Prior Publication Data

US 2008/0207038 A1    Aug. 28, 2008

Related U.S. Application Data

(63) Continuation of application No. 11/284,154, filed on Nov. 21, 2005, now Pat. No. 7,384,289.

(60) Provisional application No. 60/648,561, filed on Jan. 31, 2005.

(51) Int. Cl.
*H01R 4/60* (2006.01)

(52) U.S. Cl. ........................ 439/206; 439/190

(58) Field of Classification Search ............. 439/205, 439/206, 190
See application file for complete search history.

(56) References Cited

U.S. PATENT DOCUMENTS

| 318,186 | A | 5/1885 | Hertzog |
| 741,052 | A | 10/1903 | Mahon |
| 1,477,527 | A | 12/1923 | Raettig |
| 2,248,675 | A | 7/1941 | Huppert |
| 2,430,011 | A | 11/1947 | Gillentine |
| 2,759,163 | A | 8/1956 | Ustin et al. |
| 2,762,022 | A | 9/1956 | Benander et al. |
| 2,844,644 | A | 7/1958 | Soule, Jr. |
| 3,011,143 | A | 11/1961 | Dean |
| 3,178,669 | A | 4/1965 | Roberts |
| 3,208,030 | A | 9/1965 | Evans et al. |
| 3,286,220 | A | 11/1966 | Marley et al. ............. 439/680 |
| 3,411,127 | A | 11/1968 | Adams |
| 3,420,087 | A | 1/1969 | Hatfield |
| 3,514,740 | A | 5/1970 | Filson |
| 3,538,486 | A | 11/1970 | Shlesinger, Jr. ........... 439/268 |

(Continued)

FOREIGN PATENT DOCUMENTS

DE    1 665 181    4/1974

(Continued)

OTHER PUBLICATIONS

Finan, J.M., "Thermally Conductive Thermoplastics", LNP Engineering Plastics, Inc., Plastics Engineering 2000, www.4spe.org, 4 pages.

(Continued)

*Primary Examiner*—Tho D Ta
*Assistant Examiner*—Travis Chambers
(74) *Attorney, Agent, or Firm*—Woodcock Washburn LLP

(57) ABSTRACT

A preferred embodiment of an electrical connector includes a housing having a body. The body defines a contact-receiving aperture extending therethrough, and a heat-transfer aperture extending therethrough in substantially the same direction as the contact-receiving aperture for facilitating circulation of air through the body.

31 Claims, 5 Drawing Sheets

U.S. PATENT DOCUMENTS

| | | |
|---|---|---|
| 3,634,811 A | 1/1972 | Teagno et al. |
| 3,669,054 A | 6/1972 | Desso et al. ............... 113/119 |
| 3,692,994 A | 9/1972 | Hirschmann et al. |
| 3,748,633 A | 7/1973 | Lundergan ................. 339/217 |
| 3,845,451 A | 10/1974 | Neidecker |
| 3,871,015 A | 3/1975 | Lin et al. ..................... 357/67 |
| 3,942,856 A | 3/1976 | Mindheim et al. |
| 3,972,580 A | 8/1976 | Pemberton et al. |
| 4,070,088 A | 1/1978 | Vaden |
| 4,076,362 A | 2/1978 | Ichimura .................... 339/75 |
| 4,082,407 A | 4/1978 | Smorzaniuk et al. |
| 4,136,919 A | 1/1979 | Howard et al. |
| 4,159,861 A | 7/1979 | Anhalt ....................... 339/75 |
| 4,217,024 A | 8/1980 | Aldridge et al. ............ 339/275 |
| 4,260,212 A | 4/1981 | Ritchie et al. ............... 339/97 |
| 4,288,139 A | 9/1981 | Cobaugh et al. ............ 339/74 |
| 4,371,912 A | 2/1983 | Guzik ........................ 361/417 |
| 4,383,724 A | 5/1983 | Verhoevan ................. 439/510 |
| 4,402,563 A | 9/1983 | Sinclair ...................... 339/75 |
| 4,403,821 A | 9/1983 | Zimmerman, Jr. et al. |
| 4,473,113 A | 9/1984 | Whitfield et al. |
| 4,505,529 A | 3/1985 | Barkus ....................... 439/82 |
| 4,533,187 A | 8/1985 | Kirkman |
| 4,536,955 A | 8/1985 | Gudgeon .................... 29/840 |
| 4,545,610 A | 10/1985 | Lakritz et al. ............... 29/589 |
| 4,552,425 A | 11/1985 | Billman |
| 4,560,222 A | 12/1985 | Dambach .................... 339/75 |
| 4,564,259 A | 1/1986 | Vandame |
| 4,596,433 A * | 6/1986 | Oesterheld et al. .......... 439/206 |
| 4,685,886 A | 8/1987 | Denlinger et al. |
| 4,717,360 A | 1/1988 | Czaja ......................... 439/710 |
| 4,767,344 A | 8/1988 | Noschese .................... 439/83 |
| 4,776,803 A | 10/1988 | Pretchel et al. .............. 439/59 |
| 4,782,893 A | 11/1988 | Thomas |
| 4,790,763 A | 12/1988 | Weber et al. |
| 4,815,987 A | 3/1989 | Kawano et al. ............. 439/263 |
| 4,818,237 A | 4/1989 | Weber |
| 4,820,169 A | 4/1989 | Weber et al. |
| 4,820,182 A | 4/1989 | Harwath et al. |
| 4,867,713 A | 9/1989 | Ozu et al. .................... 439/833 |
| 4,878,611 A | 11/1989 | LoVasco et al. ........... 228/180.2 |
| 4,881,905 A | 11/1989 | Demler, Jr. et al. |
| 4,900,271 A | 2/1990 | Colleran et al. ............. 439/595 |
| 4,907,990 A | 3/1990 | Bertho et al. ............... 439/851 |
| 4,915,641 A | 4/1990 | Miskin et al. |
| 4,963,102 A | 10/1990 | Gettig et al. |
| 4,965,699 A | 10/1990 | Jorden et al. |
| 4,973,257 A | 11/1990 | Lhotak |
| 4,973,271 A | 11/1990 | Ishizuka et al. ............. 439/839 |
| 4,974,119 A | 11/1990 | Martin |
| 4,975,084 A | 12/1990 | Fedder et al. |
| 4,979,074 A | 12/1990 | Morley |
| 5,016,968 A | 5/1991 | Hammond et al. |
| 5,024,610 A | 6/1991 | French et al. |
| 5,035,639 A | 7/1991 | Kilpatrick et al. |
| 5,046,960 A | 9/1991 | Fedder et al. |
| 5,052,953 A | 10/1991 | Weber |
| 5,066,236 A | 11/1991 | Broeksteeg |
| 5,077,893 A | 1/1992 | Mosquera et al. ........... 29/882 |
| 5,082,459 A | 1/1992 | Billman et al. |
| 5,094,634 A | 3/1992 | Dixon et al. |
| 5,104,332 A | 4/1992 | McCoy |
| 5,137,959 A | 8/1992 | Block et al. |
| 5,139,426 A | 8/1992 | Barkus et al. |
| 5,151,056 A | 9/1992 | McClune |
| 5,152,700 A | 10/1992 | Bogursky et al. |
| 5,174,770 A | 12/1992 | Sasaki et al. ............... 439/108 |
| 5,194,480 A | 3/1993 | Block et al. |
| 5,213,868 A | 5/1993 | Liberty et al. |
| 5,214,308 A | 5/1993 | Nishiguchi ................. 257/692 |
| 5,238,414 A | 8/1993 | Yaegashi et al. ............ 439/108 |
| 5,254,012 A | 10/1993 | Wang ......................... 439/263 |
| 5,274,918 A | 1/1994 | Reed ........................... 29/882 |
| 5,276,964 A | 1/1994 | Anderson, Jr. et al. |
| 5,286,212 A | 2/1994 | Broeksteeg |
| 5,295,843 A | 3/1994 | Davis et al. |
| 5,298,791 A | 3/1994 | Liberty et al. |
| 5,302,135 A | 4/1994 | Lee ............................. 439/263 |
| 5,321,582 A | 6/1994 | Casperson |
| 5,381,314 A | 1/1995 | Rudy et al. ................. 361/712 |
| 5,400,949 A | 3/1995 | Hirvonen et al. ......... 228/180.22 |
| 5,427,543 A | 6/1995 | Dynia |
| 5,431,578 A | 7/1995 | Wayne ....................... 439/259 |
| 5,457,342 A | 10/1995 | Herbst, II ................... 257/712 |
| 5,458,426 A | 10/1995 | Ito |
| 5,475,922 A | 12/1995 | Tamura et al. .............. 29/881 |
| 5,490,040 A | 2/1996 | Gavdenzi et al. ........... 361/773 |
| 5,511,987 A | 4/1996 | Shnchi |
| 5,512,519 A | 4/1996 | Hwang |
| 5,533,915 A | 7/1996 | Deans |
| 5,558,542 A | 9/1996 | O'Sullivan et al. ......... 439/682 |
| 5,564,952 A | 10/1996 | Davis et al. |
| 5,577,928 A | 11/1996 | Duclos |
| 5,590,463 A | 1/1997 | Feldman et al. ............. 29/844 |
| 5,609,502 A | 3/1997 | Thumma .................... 439/747 |
| 5,618,187 A | 4/1997 | Goto ........................... 439/79 |
| 5,637,008 A | 6/1997 | Kozel ......................... 439/342 |
| 5,643,009 A | 7/1997 | Dinkel et al. |
| 5,664,968 A | 9/1997 | Mickievicz |
| 5,664,973 A | 9/1997 | Emmert et al. |
| 5,665,969 A | 9/1997 | Beusch |
| 5,667,392 A | 9/1997 | Kocher et al. |
| 5,691,041 A | 11/1997 | Frankeny et al. ........... 428/209 |
| 5,702,255 A | 12/1997 | Murphy et al. ............... 439/71 |
| 5,727,963 A | 3/1998 | LeMaster |
| 5,730,609 A | 3/1998 | Harwath ..................... 439/108 |
| 5,741,144 A | 4/1998 | Elco et al. ................... 439/101 |
| 5,741,161 A | 4/1998 | Cahaly et al. ............... 439/709 |
| 5,742,484 A | 4/1998 | Gillette et al. .............. 361/789 |
| 5,743,009 A | 4/1998 | Matsui et al. ............... 29/843 |
| 5,745,349 A | 4/1998 | Lemke ........................ 361/818 |
| 5,746,608 A | 5/1998 | Taylor ........................ 439/70 |
| 5,749,746 A | 5/1998 | Tan et al. |
| 5,755,595 A | 5/1998 | Davis et al. ................. 439/607 |
| 5,772,451 A | 6/1998 | Dozier, II et al. |
| 5,782,644 A | 7/1998 | Kiat |
| 5,787,971 A | 8/1998 | Dodson ...................... 165/121 |
| 5,795,191 A | 8/1998 | Preputnick et al. .......... 439/608 |
| 5,810,607 A | 9/1998 | Shih et al. ................... 439/66 |
| 5,817,973 A | 10/1998 | Elco et al. ................... 174/32 |
| 5,827,094 A | 10/1998 | Aizawa et al. |
| 5,831,314 A | 11/1998 | Wen |
| 5,857,857 A | 1/1999 | Fukuda |
| 5,874,776 A | 2/1999 | Kresge et al. ............... 257/747 |
| 5,876,219 A * | 3/1999 | Taylor et al. ................ 439/74 |
| 5,876,248 A | 3/1999 | Brunker et al. |
| 5,882,214 A | 3/1999 | Hillbish et al. |
| 5,883,782 A | 3/1999 | Thurston et al. ............ 364/704 |
| 5,888,884 A | 3/1999 | Wojnarowski .............. 438/462 |
| 5,908,333 A | 6/1999 | Perino et al. ................ 439/631 |
| 5,919,050 A | 7/1999 | Kehley et al. ............... 439/71 |
| 5,930,114 A | 7/1999 | Kuzmin et al. ............. 361/704 |
| 5,955,888 A | 9/1999 | Frederickson et al. ....... 324/761 |
| 5,961,355 A | 10/1999 | Morlion et al. ............. 439/686 |
| 5,971,817 A | 10/1999 | Longueville ................ 439/857 |
| 5,975,921 A | 11/1999 | Shuey ........................ 439/83 |
| 5,980,270 A | 11/1999 | Fjelstad et al. |
| 5,980,321 A | 11/1999 | Cohen et al. ................ 439/608 |
| 5,984,726 A | 11/1999 | Wu ............................. 439/607 |
| 5,993,259 A | 11/1999 | Stokoe et al. ............... 439/608 |
| 6,012,948 A | 1/2000 | Wu ............................. 439/567 |
| 6,036,549 A | 3/2000 | Wulff |
| 6,041,498 A | 3/2000 | Hillbish et al. |
| 6,050,862 A | 4/2000 | Ishii ........................... 439/843 |

| Patent No. | Date | Inventor | Class |
|---|---|---|---|
| 6,059,170 A | 5/2000 | Jimarez et al. | 228/119 |
| 6,066,048 A | 5/2000 | Lees | |
| 6,068,520 A | 5/2000 | Winings et al. | 439/676 |
| 6,071,152 A | 6/2000 | Achammer et al. | |
| 6,077,130 A | 6/2000 | Hughes et al. | |
| 6,089,878 A | 7/2000 | Meng | 439/79 |
| 6,095,827 A | 8/2000 | Dutkowsky et al. | 439/83 |
| 6,123,554 A | 9/2000 | Ortega et al. | 439/79 |
| 6,125,535 A | 10/2000 | Chiou et al. | 29/883 |
| 6,139,336 A | 10/2000 | Olson | 439/83 |
| 6,146,157 A | 11/2000 | Lenoir et al. | 439/101 |
| 6,146,202 A | 11/2000 | Ramey et al. | |
| 6,146,203 A | 11/2000 | Elco et al. | 439/608 |
| 6,152,756 A | 11/2000 | Huang et al. | 439/342 |
| 6,174,198 B1 | 1/2001 | Wu et al. | 439/541.5 |
| 6,180,891 B1 | 1/2001 | Murdeshwar | 174/260 |
| 6,183,287 B1 | 2/2001 | Po | |
| 6,183,301 B1 | 2/2001 | Paagman | 439/608 |
| 6,190,213 B1 | 2/2001 | Reichart et al. | 439/736 |
| 6,193,537 B1 | 2/2001 | Harper, Jr. et al. | |
| 6,196,871 B1 | 3/2001 | Szu | 439/571 |
| 6,202,916 B1 | 3/2001 | Updike et al. | 228/180 |
| 6,206,722 B1 | 3/2001 | Ko et al. | |
| 6,210,197 B1 | 4/2001 | Yu | 439/342 |
| 6,210,240 B1 | 4/2001 | Comerci et al. | |
| 6,212,755 B1 | 4/2001 | Shimada et al. | 29/527.1 |
| 6,215,180 B1 | 4/2001 | Chen et al. | 257/720 |
| 6,219,913 B1 | 4/2001 | Uchiyama | 29/883 |
| 6,220,884 B1 | 4/2001 | Lin | 439/342 |
| 6,220,895 B1 | 4/2001 | Lin | 439/607 |
| 6,220,896 B1 | 4/2001 | Bertoncici et al. | 439/608 |
| 6,234,851 B1 | 5/2001 | Phillips | |
| 6,238,225 B1 | 5/2001 | Middlehurst et al. | |
| 6,257,478 B1 | 7/2001 | Straub | 228/6.2 |
| 6,259,039 B1 | 7/2001 | Chroneos, Jr. et al. | 174/263 |
| 6,261,132 B1 | 7/2001 | Koseki et al. | |
| 6,269,539 B1 | 8/2001 | Takahashi et al. | 29/883 |
| 6,274,474 B1 | 8/2001 | Caletka et al. | 438/613 |
| 6,280,230 B1 | 8/2001 | Takase et al. | |
| 6,293,827 B1 | 9/2001 | Stokoe | 439/608 |
| 6,299,492 B1 | 10/2001 | Pierini et al. | |
| 6,309,245 B1 | 10/2001 | Sweeney | 439/507 |
| 6,319,075 B1 | 11/2001 | Clark et al. | 439/825 |
| 6,322,377 B2 | 11/2001 | Middlehurst et al. | |
| 6,328,602 B1 | 12/2001 | Yamasaki et al. | 439/608 |
| 6,347,952 B1 | 2/2002 | Hasegawa et al. | 439/608 |
| 6,350,134 B1 | 2/2002 | Fogg et al. | 439/79 |
| 6,359,783 B1 | 3/2002 | Noble | 361/704 |
| 6,360,940 B1 | 3/2002 | Bolde et al. | 228/264 |
| 6,362,961 B1 | 3/2002 | Chiou | 361/704 |
| 6,363,607 B1 | 4/2002 | Chen et al. | 29/883 |
| 6,371,773 B1 | 4/2002 | Crofoot et al. | 439/79 |
| 6,379,188 B1 | 4/2002 | Cohen et al. | 439/608 |
| 6,386,924 B2 | 5/2002 | Long | |
| 6,394,818 B1 | 5/2002 | Smalley, Jr. | |
| 6,402,566 B1 | 6/2002 | Middlehurst et al. | |
| 6,409,543 B1 | 6/2002 | Astbury, Jr. et al. | 439/608 |
| 6,428,328 B2 | 8/2002 | Haba et al. | |
| 6,431,914 B1 | 8/2002 | Billman | 439/608 |
| 6,435,914 B1 | 8/2002 | Billman | 439/608 |
| 6,450,829 B1 | 9/2002 | Weisz-Margulescu | |
| 6,461,183 B1 | 10/2002 | Ohkita et al. | |
| 6,461,202 B2 | 10/2002 | Kline | 439/701 |
| 6,471,523 B1 | 10/2002 | Shuey | |
| 6,471,548 B2 | 10/2002 | Bertoncini et al. | 439/608 |
| 6,472,474 B2 | 10/2002 | Burkhardt et al. | |
| 6,488,549 B1 | 12/2002 | Weller et al. | |
| 6,489,567 B2 | 12/2002 | Zachrai | |
| 6,506,081 B2 | 1/2003 | Blanchfield et al. | 439/682 |
| 6,514,103 B2 | 2/2003 | Pape et al. | |
| 6,537,111 B2 | 3/2003 | Brammer et al. | 439/857 |
| 6,544,046 B1 | 4/2003 | Hahn et al. | 439/83 |
| 6,551,112 B1 | 4/2003 | Li et al. | 439/66 |
| 6,554,647 B1 | 4/2003 | Cohen et al. | 439/607 |
| 6,572,410 B1 | 6/2003 | Volstorf et al. | 439/608 |
| 6,575,774 B2 | 6/2003 | Ling et al. | |
| 6,575,776 B1 | 6/2003 | Conner et al. | |
| 6,592,381 B2 | 7/2003 | Cohen et al. | |
| 6,604,967 B2 | 8/2003 | Middlehurst et al. | |
| 6,629,854 B2 | 10/2003 | Murakami | |
| 6,652,318 B1 | 11/2003 | Winings et al. | 439/608 |
| 6,663,426 B2 | 12/2003 | Hasircoglu et al. | 439/608 |
| 6,665,189 B1 | 12/2003 | Lebo | 361/730 |
| 6,669,514 B2 | 12/2003 | Wiebking et al. | |
| 6,672,884 B1 | 1/2004 | Toh et al. | |
| 6,672,907 B2 | 1/2004 | Azuma | 439/682 |
| 6,692,272 B2 | 2/2004 | Lemke et al. | 439/108 |
| 6,702,594 B2 | 3/2004 | Lee et al. | 439/83 |
| 6,705,902 B1 | 3/2004 | Yi et al. | |
| 6,712,621 B2 | 3/2004 | Li et al. | 439/65 |
| 6,716,068 B2 | 4/2004 | Wu | |
| 6,740,820 B2 | 5/2004 | Cheng | 174/260 |
| 6,743,037 B2 | 6/2004 | Kassa et al. | 439/342 |
| 6,746,278 B2 | 6/2004 | Nelson et al. | 439/608 |
| 6,769,883 B2 | 8/2004 | Brid et al. | |
| 6,769,935 B2 | 8/2004 | Stokoe et al. | |
| 6,776,635 B2 | 8/2004 | Blanchfield et al. | |
| 6,776,649 B2 | 8/2004 | Pape et al. | |
| 6,780,027 B2 | 8/2004 | Allison | |
| 6,790,088 B2 | 9/2004 | Ono et al. | |
| 6,796,831 B1 | 9/2004 | Yasfuku et al. | |
| 6,810,783 B1 | 11/2004 | Larose | |
| 6,811,440 B1 | 11/2004 | Rothermel et al. | |
| 6,814,590 B2 | 11/2004 | Minich et al. | |
| 6,829,143 B2 | 12/2004 | Russell et al. | 361/704 |
| 6,835,103 B2 | 12/2004 | Middlehurst et al. | |
| 6,843,687 B2 | 1/2005 | McGowan et al. | |
| 6,848,886 B2 | 2/2005 | Schmaling et al. | |
| 6,848,950 B2 | 2/2005 | Allison et al. | |
| 6,848,953 B2 | 2/2005 | Schell et al. | |
| 6,869,294 B2 | 3/2005 | Clark et al. | |
| 6,884,117 B2 | 4/2005 | Korsunsky et al. | |
| 6,890,221 B2 | 5/2005 | Wagner | 439/855 |
| 6,905,367 B2 | 6/2005 | Crane, Jr. et al. | |
| 6,923,685 B2 | 8/2005 | Holmes | |
| 6,929,504 B2 | 8/2005 | Ling et al. | |
| 6,947,012 B2 | 9/2005 | Aisenbrey | 343/906 |
| 6,969,268 B2 | 11/2005 | Brunker | |
| 6,975,511 B1 | 12/2005 | Lebo et al. | 361/703 |
| 6,994,569 B2 | 2/2006 | Minich et al. | |
| 7,001,189 B1 | 2/2006 | McGowan et al. | |
| 7,059,892 B1 | 6/2006 | Trout | |
| 7,059,919 B2 | 6/2006 | Clark et al. | |
| 7,065,871 B2 | 6/2006 | Minich et al. | |
| 7,070,464 B2 | 7/2006 | Clark et al. | |
| 7,074,096 B2 | 7/2006 | Copper et al. | |
| 7,097,465 B1 * | 8/2006 | Korsunsky et al. | 439/74 |
| 7,101,228 B2 | 9/2006 | Hammer et al. | |
| 7,104,812 B1 | 9/2006 | Bogiel et al. | |
| 7,114,963 B2 | 10/2006 | Shuey et al. | |
| RE039,380 E | 11/2006 | Davis | |
| 7,137,848 B2 | 11/2006 | Trout et al. | |
| 7,163,421 B1 | 1/2007 | Cohen | |
| 7,168,963 B2 | 1/2007 | Minich et al. | |
| 7,182,642 B2 | 2/2007 | Ngo et al. | 439/608 |
| 7,204,699 B2 | 4/2007 | Stoner | |
| D542,736 S | 5/2007 | Rico | |
| 7,220,141 B2 | 5/2007 | Daily et al. | |
| 7,258,562 B2 | 8/2007 | Daily et al. | |
| 7,273,382 B2 | 9/2007 | Igarashi et al. | |
| 7,303,427 B2 | 12/2007 | Swain | |
| 7,335,043 B2 | 2/2008 | Hgo et al. | |
| 7,384,289 B2 * | 6/2008 | Minich | 439/206 |
| 7,425,145 B2 | 9/2008 | Ngo | |
| 7,458,839 B2 | 12/2008 | Ngo et al. | |
| 7,476,108 B2 | 1/2009 | Swain et al. | |

| | | |
|---|---|---|
| 2001/0003685 A1 | 6/2001 | Aritani ............... 439/485 |
| 2001/0049229 A1 | 12/2001 | Pape et al. |
| 2002/0142676 A1 | 10/2002 | Hosaka et al. ............. 439/874 |
| 2002/0159235 A1 | 10/2002 | Miller et al. ............ 361/704 |
| 2002/0193019 A1 | 12/2002 | Blanchfield et al. |
| 2003/0013330 A1 | 1/2003 | Takeuchi ............ 439/83 |
| 2003/0119378 A1 | 6/2003 | Avery |
| 2003/0143894 A1 | 7/2003 | Kline et al. ............. 439/608 |
| 2003/0219999 A1 | 11/2003 | Minich et al. |
| 2003/0220021 A1 | 11/2003 | Whiteman, Jr. et al. ..... 439/608 |
| 2003/0236035 A1 | 12/2003 | Kuroda et al. |
| 2004/0147177 A1 | 7/2004 | Wagner |
| 2004/0183094 A1 | 9/2004 | Caletka et al. ............. 257/178 |
| 2005/0112952 A1 | 5/2005 | Wang et al. |
| 2006/0003620 A1 | 1/2006 | Daily et al. ............. 439/295 |
| 2006/0128197 A1 | 6/2006 | McGowan et al. |
| 2006/0228927 A1 | 10/2006 | Daily |
| 2006/0228948 A1 | 10/2006 | Swain |
| 2006/0281354 A1 | 12/2006 | Ngo et al. |
| 2007/0197063 A1 | 8/2007 | Ngo |
| 2007/0202748 A1 | 8/2007 | Daily |
| 2007/0275586 A1 | 11/2007 | Ngo |
| 2007/0293084 A1 | 12/2007 | Ngo |
| 2008/0038956 A1 | 2/2008 | Swain |
| 2008/0248670 A1 | 10/2008 | Daily et al. |

FOREIGN PATENT DOCUMENTS

| | | |
|---|---|---|
| DE | 102 26 279 C1 | 11/2003 |
| EP | 0 273 683 A2 | 7/1988 |
| EP | 0 321 257 B1 | 4/1993 |
| EP | 0 623 248 B1 | 11/1995 |
| EP | 0 789 422 A2 | 8/1997 |
| EP | 0091449 B1 | 9/2004 |
| GB | 1 162 705 | 8/1969 |
| JP | 05/344728 | 12/1993 |
| JP | 06-236788 | 8/1994 |
| JP | 06/068943 | 11/1994 |
| JP | 07-114958 | 5/1995 |
| JP | 07/169523 | 7/1995 |
| JP | 08/096918 | 4/1996 |
| JP | 0 812 5379 | 5/1996 |
| JP | 09/199215 | 7/1997 |
| JP | 2000-003743 | 1/2000 |
| JP | 2000-003744 | 1/2000 |
| JP | 2000-003745 | 1/2000 |
| JP | 2000-003746 | 1/2000 |
| JP | 2000/228243 | 5/2000 |
| JP | 13/135388 | 5/2001 |
| JP | 2003/217785 | 7/2003 |
| KR | 100517561 B1 | 9/2005 |
| TW | 546 872 | 8/2003 |
| TW | 576 555 | 2/2004 |
| WO | WO 97/43885 | 11/1997 |
| WO | WO97/44859 | 11/1997 |
| WO | WO 98/15989 | 4/1998 |
| WO | WO 0016445 | 3/2000 |
| WO | WO 01/29931 A1 | 4/2001 |
| WO | WO 01/39332 A1 | 5/2001 |
| WO | WO 02103847 | 12/2002 |
| WO | WO 2005065254 | 7/2005 |
| WO | WO2008/117180 A9 | 10/2008 |
| WO | WO 2007064632 | 6/2009 |

OTHER PUBLICATIONS

Sherman, L.M., "Plastics that Conduct Heat", Plastics Technology Online, Jun. 2001, http://www.plasticstechnology.com, 4 pages.
Ogando, J., "And now-An Injection-Molded Heat Exchanger", Sure, plastics are thermal insulators, but additive packages allow them to conduct heat instead, Global Design News, Nov. 1, 2000, 4 pages.
In the United States Patent and Trademark Office, Office Action Summary-Final Rejection of U.S. Appl. No. 11/255,295, Dated Oct. 11, 2007, 10 pages.
In the United States Patent and Trademark Office, Office Action Summary of U.S. Appl. No. 11/255,295, Dated Apr. 25, 2007, 11 pages.
In the United States Patent and Trademark Office, Office Action Summary of U.S. Appl. No. 11/255,295, Dated Dec. 21, 2006, 16 pages.
U.S. Appl. No. 12/317,366, filed Dec. 22, 2008, Minich.
Metral 1000 Series, PCB Mounted Receptacle Assembly, FCI Web Site page, 2001, 1 p.
Power TwinBlade™ I/O Cable Connector RA-North-South, No. GS-20_072, Aug. 6, 2007, 11 pages.
Product Datasheets, 10 Bgit/s XENPAK 850 nm Transponder (TRP1OGVP2045), Copyright 2005, MergeOptics GmbH, 13 pages.
Product Datasheets, Welome to XENPAK.org., Copyright 2001, http://www.xenpak.org., 1 page.
Restriction Requirement for U.S. Appl. No. 12/214,612, dated May 22, 2009.
Response to Restriction Requirement filed in U.S. Appl. No. 12/214,612, dated Jun. 22, 2009.
Nonfinal Rejection for U.S. Appl. No. 12/214,612, dated Sep. 24, 2009.
Amendment filed in U.S. Appl. No. 12/214,612, dated Dec. 17, 2009.

* cited by examiner

SURFACE-MOUNT CONNECTOR

This is a continuation of U.S. application Ser. No. 11/284,154, filed on Nov. 21, 2005, now issued as U.S. Pat. No. 7,384,289, which claims the benefit of Provisional Application No. 60/648,561, filed on Jan. 31, 2005, the contents of all of which are incorporated by reference herein. This application is related to U.S. application Ser. No. 11/255,295 filed on Oct. 20, 2005, now issued as U.S. Pat. No. 7,476,108, which claims priority under 35 U.S.C. § 119(e) to U.S. Provisional Application No. 60/638,470, filed Dec. 22, 2004; and U.S. Provisional Application No. 60/668,350, filed Apr. 5, 2005. The contents of each of these applications is incorporated by reference herein in its entirety.

FIELD OF THE INVENTION

The present invention relates generally to electrical connectors. More specifically, the invention relates to a surface-mount connector, such as a ball-grid array connector ("BGA connector"), having features that permit air to circulate through the connector.

BACKGROUND OF THE INVENTION

Surface-mount connectors such as BGA connectors typically include a plurality of electrically-conductive contacts mounted in a housing. Each conductor has a solder ball attached to a tail portion thereof. The solder balls collectively form a ball grid array.

The solder balls are used to form electrical and mechanical connections between the connector and a substrate, such as a printed-circuit board (PCB), on which the connector is mounted. The connector is mounted on the substrate by heating the solder balls to their melting point. The melted solder subsequently cools and re-hardens to form solder connections between the connector and the substrate.

The solder balls can be heated by placing the connector and the substrate in a convection reflow oven. The oven directs heated air over the connector. Heat is transferred to the solder balls directly and indirectly, by a combination of conductive and convective heat transfer.

The rate of heat transfer to the individual solder balls usually is not uniform throughout the ball grid array. In particular, the heated air primarily contacts the outermost surfaces the connector, and the outermost solder balls in the ball-grid array, i.e., the solder balls located proximate to the outer perimeter of the ball-grid array. The outermost solder balls therefore tend to receive a higher amount of thermal energy than the innermost, i.e., centrally-located, solder balls.

The need to transfer sufficient thermal energy to the innermost portion of the connector to melt the centrally-located solder balls can be addressed by slowing the speed of the connector and the substrate through the convection reflow oven, i.e., by increasing the dwell time of the connector and the substrate in the oven. This approach can lower the yield of the oven, i.e., number of connector and substrate pairs that can be processed in the oven per unit time.

Alternatively, the temperature of the heated air within the convection reflow oven can be increased. This approach, however, can result in unintended connector, substrate, or component damage.

SUMMARY OF THE INVENTION

To help solve uneven heating of surface-mount connectors having fusible elements such as solder balls, the present invention includes an electrical connector that has heat-transfer passages, and other passages fluidly connected to the heat-transfer passages. In general, one aspect of the present invention is to expose more of the center portion of the connector to: (i) heated air during reflow; and (ii) ambient airflow to help cool the connector in operation.

A preferred embodiment of an electrical connector comprises a housing including a body. The body defines a contact-receiving aperture extending therethrough, and a heat-transfer aperture extending therethrough in substantially the same direction as the contact-receiving aperture for facilitating circulation of air through the body.

A preferred embodiment of an electrical connector for mounting on a substrate comprises a plurality of insert molded leadframe assemblies each comprising a frame, and a plurality of electrically-conductive contacts mounted on the frame. The connector also comprises a housing having a body including a first face that faces the substrate when the connector is mounted thereon, and a second face. The body has a first plurality of apertures formed therein and extending between the first and second faces for receiving the contacts, and a second plurality of apertures formed therein and extending between the first and second faces.

The insert-molded leadframe assemblies are secured to the housing so that the first face of the housing and adjacent ones of the insert-molded leadframe assemblies define passages that adjoin the second plurality of apertures.

Another preferred embodiment of an electrical connector comprises a first and a second linear array of electrically-conductive contacts, a plurality of fusible elements each attached to a respective one of the contacts, and a housing having a body. The body has a first and a second linear array of apertures formed therein for receiving the respective first and second liner arrays of contacts, and a third linear array of apertures positioned between the first and second linear arrays of apertures for permitting air to flow through the body.

BRIEF DESCRIPTION OF THE DRAWINGS

The foregoing summary, as well as the following detailed description of a preferred embodiment, are better understood when read in conjunction with the appended diagrammatic drawings. For the purpose of illustrating the invention, the drawings show an embodiment that is presently preferred. The invention is not limited, however, to the specific instrumentalities disclosed in the drawings. In the drawings.

DETAILED DESCRIPTION OF ILLUSTRATIVE EMBODIMENTS

Figure 3:
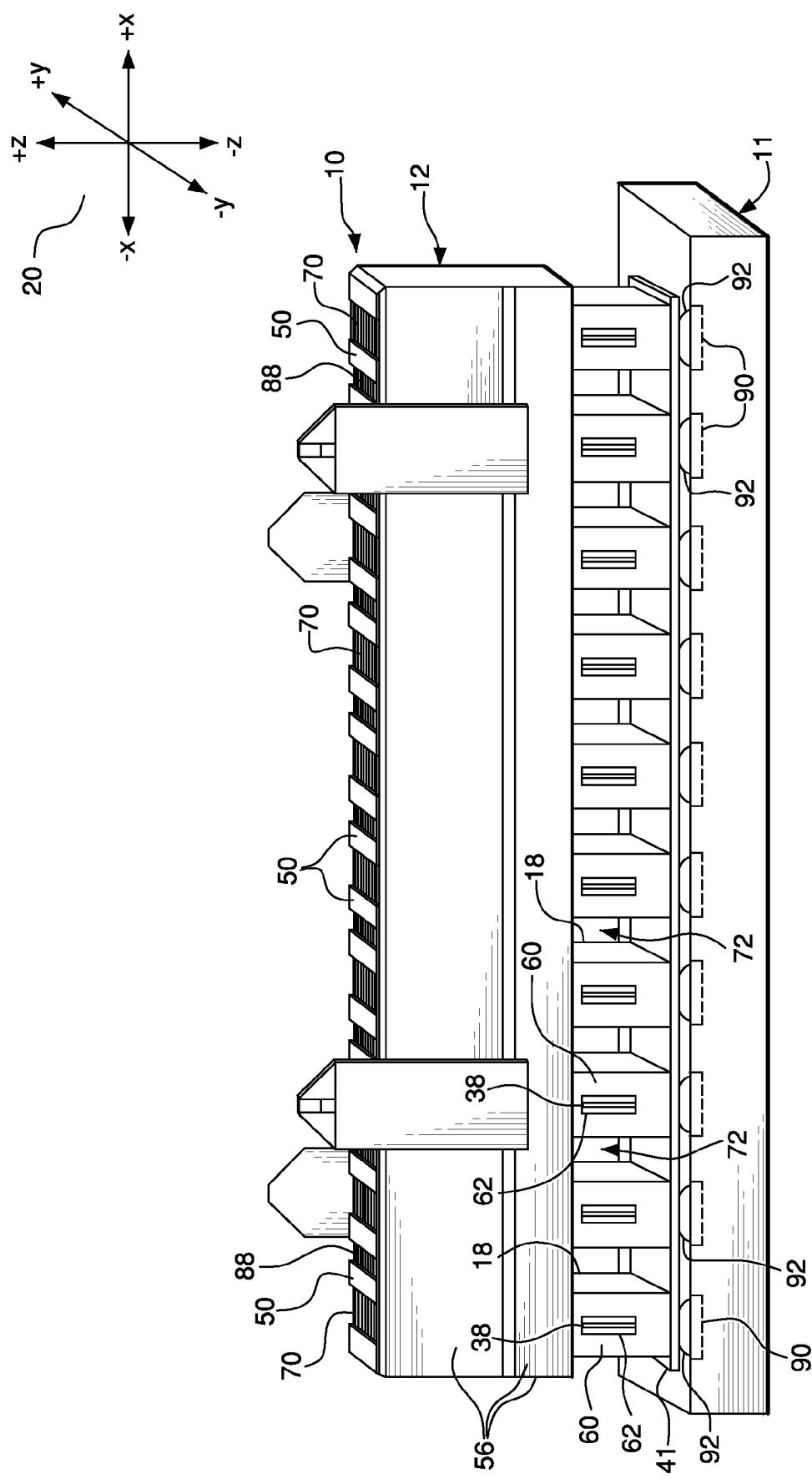
FIG. 3 is a side view of the BGA-type connector shown in FIGS. 1 and 2, depicting the connector mounted on a substrate.

The figures depict a preferred embodiment of a BGA-type connector 10. The figures are each referenced to a common coordinate system 20 depicted therein. The connector 10 can be mounted on a substrate 11, as shown in FIG. 3. The connector 10 comprises a housing 12, and a plurality of insert-molded leadframe assemblies (IMLAs) 14 mechanically coupled to the housing 10.

Figure 5:
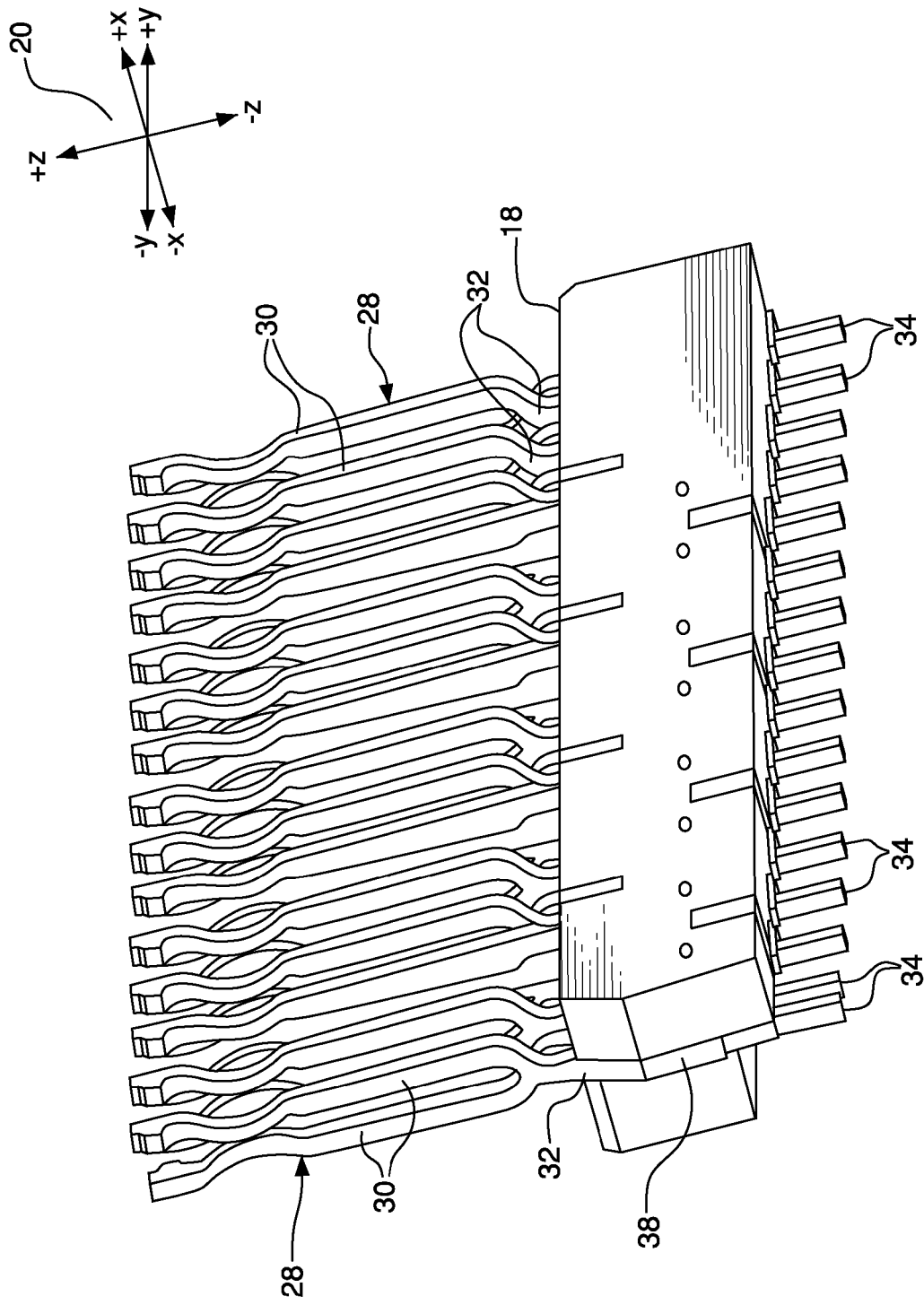
FIG. 5 is a perspective view of an insert-molded leadframe assembly of the BGA-type connector shown in FIGS. 1-4.

Each IMLA 14 includes electrically-conductive contacts 16. Each IMLA 14 also includes an overmolded frame 18 for holding the contacts 16, so that the contacts 16 of each IMLA 14 form a linear array. The frame 18, which is best shown in FIG. 5, is formed from a suitable electrically-insulative material such as plastic. The connector 10, in turn, carries the IMLAs 14. Any number of the IMLAs 14 or the electrical contacts 16 can be used, depending on the desired contact density.

Each contact 16 includes a mating portion 28, as shown in FIG. 5. The contacts 16 can be, for example, flexible dual beam mating contacts in which the mating portion 28 comprises two contact beams 30. The contact beams 30 of each contact 16 can receive a complementary contact beam (not shown) of another connector or electrical device when the connector 10 is mated therewith.

Each contact 16 also includes a middle portion 32 that adjoins the mating portion 28, and a tail portion 34 that adjoins the middle portion 32. The frame 18 of each IMLA 14 is molded around the middle portion 32, or some other suitable portion of the corresponding contact 16. The contacts 16 located at the opposing ends of each IMLA 14 can each include a tab 38, the purpose of which is discussed below.

Other configurations for the contacts 16 are possible in alternative embodiments. For example, a contact having a tail portion comprising two spring beams can be used in the alternative. This type of contact is described in pending U.S. patent application Ser. No. 11/022,137, filed Dec. 23, 2004, the contents of which is incorporated by reference herein in its entirety.

Figure 4:
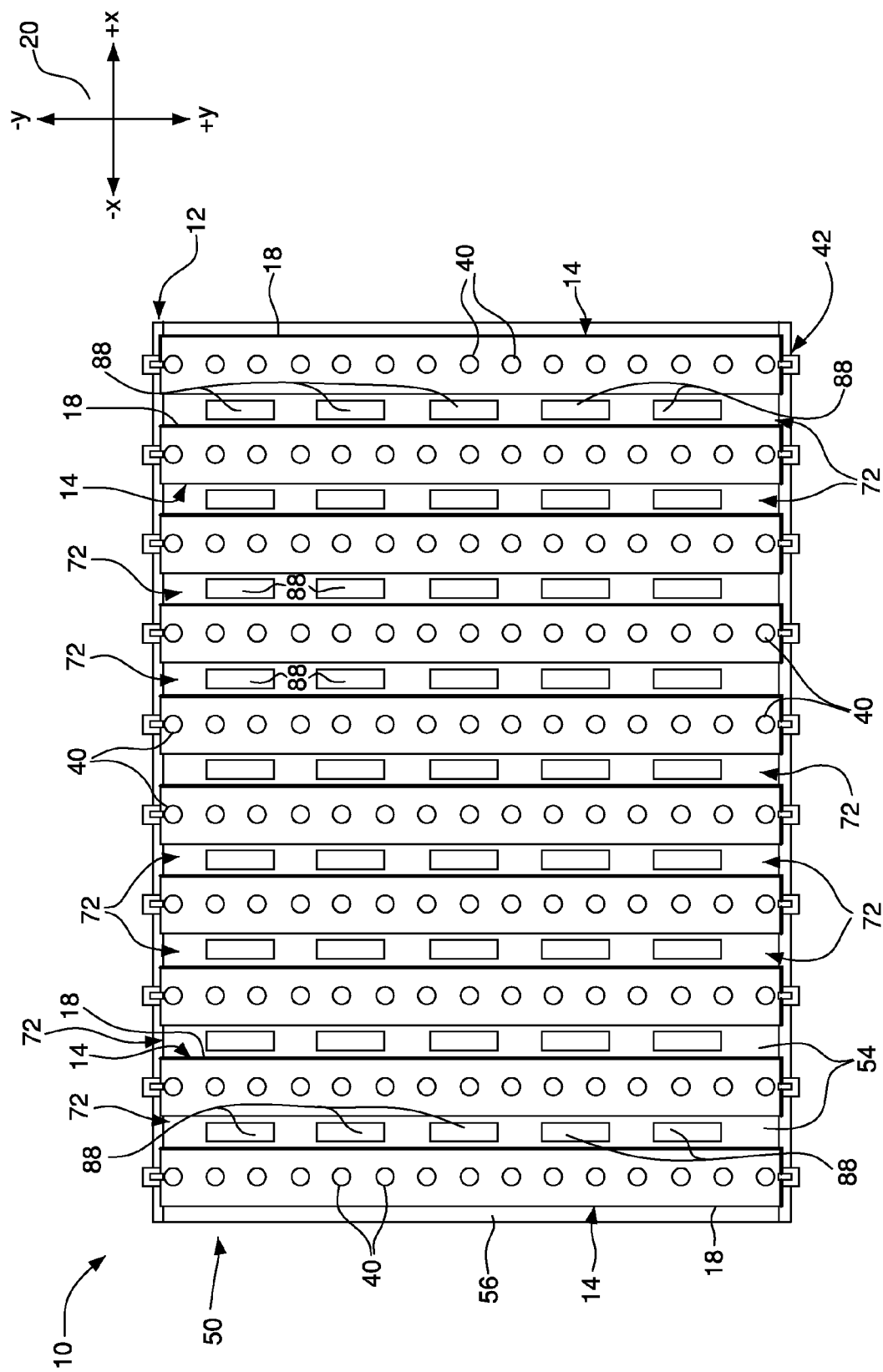
FIG. 4 is a bottom view of the BGA-type connector shown in FIGS. 1-3, with a wafer of the connector not shown.

The connector 10 preferably includes a plurality of fusible elements in the form of solder balls 40, and a wafer 41. Each solder ball 40 is attached to the tail portion 34 of a corresponding one of the contacts 16. The solder balls 40 collectively form a ball-grid array 42 below the connector 10, as shown in FIG. 4.

Figure 2:
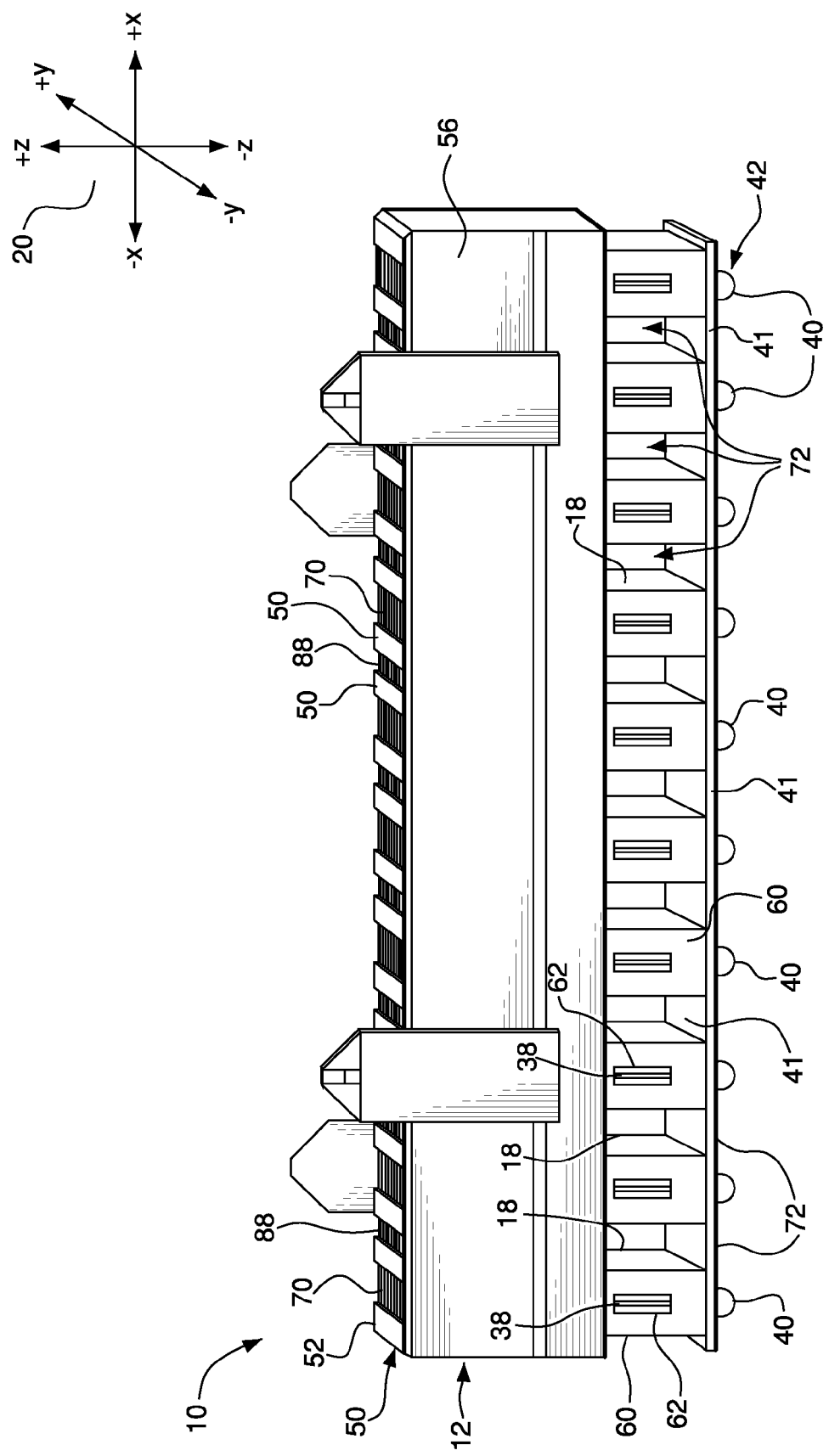
FIG. 2 is a side view of the BGA-type connector shown in FIG. 1.

The wafer 41 is positioned between the ball grid array 42 and the frames 18 of the IMLAs 14, as shown in FIGS. 2 and 3. The wafer 41 has a plurality of apertures and optional pockets formed therein. Each aperture is associated with one of the optional pockets. The tail portion 34 of each contact 16 extends through the wafer 41 by way of an associated one of the apertures. When used, each pocket receives a portion of an associated one of the solder balls 40 during a first reflow operation. The pockets help to locate the solder balls 40 with respect to the tail portions 34 of the contacts 16. The solder balls 40, as discussed below, are melted during a second reflow operation to form solder connections 92 between the connector 10 and the substrate 11 when the connector 10 is mounted on the substrate 11.

Directional terms such as "above," "below," "upper," "lower," etc. are used with reference to the component orientations depicted in FIGS. 2 and 3. These terms are used for exemplary purposes only, and unless otherwise noted, are not meant to limit the scope of the appended claims.

Figure 1:
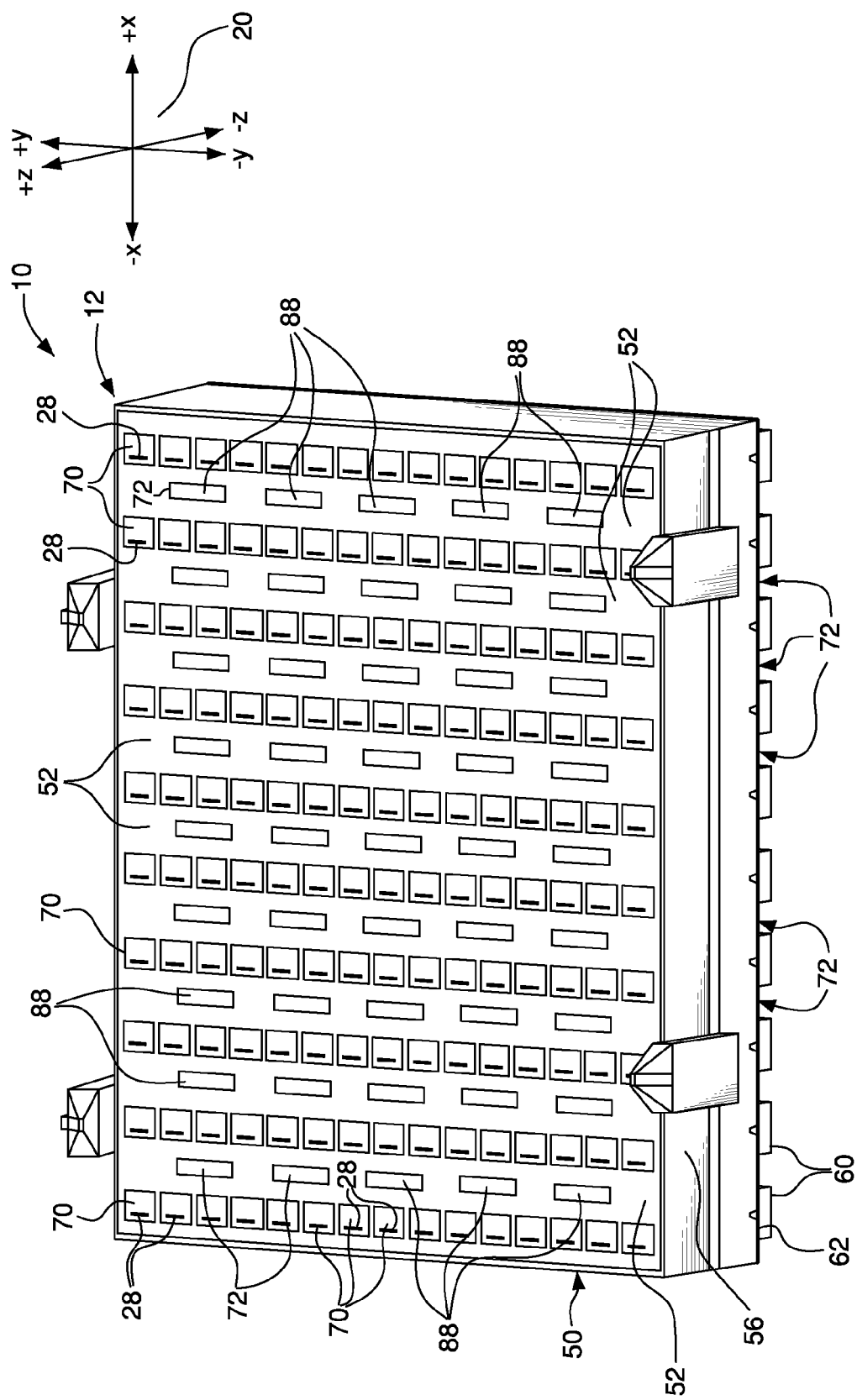
FIG. 1 is a top perspective view of a preferred embodiment of a BGA-type surface-mount connector.

The housing 12 includes a body 50. The body 50 has an upper surface, or mating face 52, and a lower surface, or mounting face 54. The mating face 52 and the mounting face 54 are best shown in FIGS. 1 and 4, respectively. The body 50 also includes side portions 56 that adjoin the respective outer edges of the mating face 52 and mounting face 54.

The body 50 has a plurality of contact-receiving apertures 70 formed therein, as best shown in FIG. 1. The contact-receiving apertures 70 extend between the mating face 52 and the mounting face 54. Each of the contact-receiving apertures 70 receives the mating portion 28 of a corresponding one of the contacts 16. The contact-receiving apertures 70 are arranged to match the linear arrays of the contacts 16 formed by each IMLA 14.

The housing 12 also includes a plurality of retaining legs 60, as best shown in FIGS. 1-3. The retaining legs 60 extend downward from an opposing two of the side portions 56. Each retaining leg 60 has a slot 62 formed therein.

Opposing pairs of the retaining legs 60 retain a corresponding one of the IMLAs 14. In particular, the slots 62 in the retaining legs 60 each receive a corresponding one of the tabs 38 on the outermost end contacts 16 of each IMLA 14. The tabs 38 and the slots 62 are sized so that the each tab 38 fits snugly within the corresponding slot 62, thereby securing the outermost contacts 16, and the rest of the corresponding IMLA 14, to the housing 12.

Adjacent ones of the retaining legs 60 are spaced apart, as best shown in FIGS. 2-4. The frame 18 of each IMLA 14 has a width, or "x" dimension, approximately equal to the width, or "x" dimension, of the retaining legs 60. The noted spacing of the retaining legs 60 thus causes the frames 18 of adjacent ones of the IMLAs 14 to be spaced apart by a corresponding amount. The spacing arrangement results in voids, or passages 72 between adjacent ones of the frames 18. Each passage 72 is defined by adjacent ones of the frames 68, and the adjacent portion of the mounting face 54. The passages 72 extend in substantially the same direction as the frames 18, i.e., the passages 72 extend substantially in the "y" direction.

The passages 72, as discussed in detail below, can facilitate air circulation that helps to heat the solder balls 40 as the solder balls 40 are melted to form the solder connections 92 between the connector 10 and the substrate 11. The width, or "x" dimension, of each passage 72 therefore should be sufficient to facilitate airflow therethrough. In the connector 10, the width of each passage 72 is approximately half the respective widths of the retaining legs 60 and the frames 18. It should be noted that this particular dimensional relationship is described for exemplary purposes only. Other dimensional relationships can be used in the alternative. For example, the width of the passages 72 can be increased or decreased, depending on the desired contact density.

The body 50 has a plurality of heat-transfer apertures 88 formed therein, as best shown in FIGS. 1 and 4. The heat-transfer apertures 88 extend between the mating face 52 and the mounting face 54. The heat-transfer apertures 88, as discussed in detail below, can facilitate air circulation that helps to heat the solder balls 40 as the solder balls 40 are melted to form the solder connections 92 between the connector 10 and the substrate 11.

A row of the heat-transfer apertures 88 is preferably formed between each adjacent row of the contact-receiving apertures 70. The bottom of each heat-transfer aperture 88 fluidly connects to a corresponding one of the passages 72. Any number of heat-transfer apertures 88 can be disposed in each row thereof, although rows of five or more of the heat-transfer apertures 88 are preferred. The heat-transfer apertures 70 preferably are rectangular, although other shapes can be used in the alternative.

The solder balls 40, as noted above, are melted in a reflow operation to form solder connections 92 between the connector 10 and the substrate 11 when the connector 10 is mounted on the substrate 11. In particular, the connector 10 preferably is placed on the substrate 11 so that each solder ball 40 substantially aligns with a corresponding electrically-conductive contact pad 90 on the substrate 11. The connector 10 and the substrate 11 are then heated by a thermally-excited medium, such as heated air.

The heating of the solder balls 40 eventually causes the solder balls 40 to melt and form solder connections 92 between each corresponding pair of contacts 16 and solder pads 90. The solder connections 92 are depicted diagrammatically in FIG. 3.

The liquid solder from the solder balls 40 is allowed to cool after the connector 10 and the substrate 11 exit the oven. The liquid solder, upon cooling, solidifies into the solder connections 92. The solder connections 92 electrically and mechanically couple the connector 10 to the contacts pads 90 of the substrate 11.

The heat-transfer apertures 88 and the passages 72 increase the rate of heat transfer to the solder balls 40. In particular, the heat-transfer apertures 88 adjoin the passages 72, as noted above. Therefore, the heat transfer apertures 88 and the passages 72 provide a fluid path for heated air flowing over the connector 10.

Once entering the passages 72, some of the heated air can reach the solder balls 40 by way of additional apertures formed in the wafer 41, such as between columns or rows of contact/solder ball ends, thereby increasing the heat-transfer rate to the solder balls 40. Moreover, convective heat transfer can occur to the structure of the connector 10 that defines the passages 72. For example, the heated air can warm the frames 18 of the IMLAs 14. Conductive heat transfer from the frames 18 to the associated contacts 16 and solder balls 40 can further warm the solder balls 40.

The heat-transfer apertures 88 and the passages 72 can thus increase the rate of heat transfer to the solder balls 40, and in particular to the innermost, i.e., centrally-located, solder balls 40 in the ball-grid array 42. The heat-transfer apertures 88 and the passages 72 can thereby help to substantially reduce or eliminate the disparity in the temperature of the outermost and innermost of the contacts 16 that could otherwise occur during the reflow process.

The heat-transfer apertures 88 and the passages 72 therefore can potentially eliminate the need to subject the connector 10 and the substrate 11 to excessive temperatures or relatively lengthy dwell times in the solder reflow oven to ensure adequate heating of the innermost solder balls 40. In addition, the heat-transfer apertures 88 and the passages 72 can potentially enhance the uniformity, integrity, and reliability of the solder connections 92. In addition, the heat flow may also make it easier to remove a connector that is already soldered to a substrate. An attached connector has less clearance between the bottom of the connector and the surface of the substrate. This makes heating solder connections at an interior point on the BGA pattern more difficult. The present invention helps to alleviate this problem.

The heat-transfer apertures 88 and the passages 72 can be used in connection with other techniques to affect the heating of the solder balls 40. For example, the connector 10, and alternative embodiments thereof, can be equipped with a cap such as the cap disclosed in pending U.S. patent application Ser. No. 10/340,279, filed Jan. 10, 2003, the contents of which is incorporated by reference herein in its entirety, to retard the melting of the solder balls 40 by blocking the apertures 88 and the passageways 72.

Moreover, the heat-transfer apertures 88 and the passages 72 can facilitate circulation of ambient air through the connector 10 in operation, thereby helping to cool the connector 10.

The foregoing description is provided for the purpose of explanation and is not to be construed as limiting the invention. While the invention has been described with reference to preferred embodiments or preferred methods, it is understood that the words which have been used herein are words of description and illustration, rather than words of limitation. Furthermore, although the invention has been described herein with reference to particular structure, methods, and embodiments, the invention is not intended to be limited to the particulars disclosed herein, as the invention extends to all structures, methods and uses that are within the scope of the appended claims. Those skilled in the relevant art, having the benefit of the teachings of this specification, may effect numerous modifications to the invention as described herein, and changes may be made without departing from the scope and spirit of the invention as defined by the appended claims.

For example alternative embodiments of the connector 10 can be configured without the passages 72 or the heat-transfer apertures 88. In other words, alternative embodiments can include the passages 72 without the heat-transfer apertures 88. Other alternative embodiments can include the heat-transfer apertures 88 without the passages 72. Moreover, the principles of the invention can be applied to plug connectors, as well receptacle connectors. The principles of the invention can also be applied any type of object that is surface mounted, including but not limited to right-angle connectors.

What is claimed:

1. An electrical connector, comprising: a housing including a body, the body defining a first column of apertures extending therethrough, and a second column of apertures extending therethrough, in substantially the same direction as the first column of apertures, wherein (i) an electrical contact is mounted in each aperture of the first column of apertures, (ii) each aperture of the second column of apertures is a heat-transfer aperture for facilitating circulation of air through the body, and each aperture of the second column of apertures does not contain an electrical contact, (iii) a first aperture of the first column of apertures is spaced apart from an adjacent aperture of the first column of apertures by a first distance, (iv) a first aperture of the second column of apertures is spaced apart from an adjacent aperture of the second column of apertures by a second distance, and (v) the second distance is greater than the first distance.

2. The electrical connector of claim 1, wherein the electrical contacts are arranged in pairs.

3. The electrical connector of claim 1, wherein the apertures of the second column of apertures are evenly spaced apart.

4. The electrical connector of claim 1, wherein each aperture of the second column of apertures is positioned so that each aperture is adjacent to at least a portion of two apertures of the first column of apertures.

5. The electrical connector of claim 1, further comprising a first electrically-insulative frame carrying the electrical contacts, and a second electrically-insulative frame carrying additional electrical contacts and disposed adjacent the first electrically insulative frame, wherein the frames define a passage therebetween that is fluidly connected to the apertures of the second column of apertures.

6. The electrical connector of claim 5, wherein the passage is defined by a mounting face of the housing.

7. The electrical connector of claim 5, wherein the apertures of the second column of aperture extends substantially in a first direction, and the passage extends substantially in a second direction perpendicular to the first direction.

8. An electrical connector comprising:
a housing having a first column of apertures extending therethrough and a second column of apertures extending therethrough, in substantially the same direction as the first column of apertures; and a plurality of electrical contacts, each electrical contact being mounted in a respective aperture of the first column of apertures, wherein the apertures of the second column of apertures are heat-transfer apertures for facilitating circulation of air through the housing, and each aperture of the second column of apertures is positioned so that each aperture is adjacent to at least a portion of two apertures of the first column of apertures.

9. The electrical connector of claim 8, wherein (i) each aperture of the second column of apertures has a height and a width, and (ii) each aperture of the second column of apertures is uninterrupted throughout its height and width.

10. The electrical connector of claim 8, wherein (i) a first aperture of the first column of apertures is spaced apart from an adjacent aperture of the first column of apertures by a first distance, (ii) a first aperture of the second column of apertures is spaced apart from an adjacent aperture of the second column of apertures by a second distance, and (iii) the second distance is greater than the first distance.

11. The electrical connector of claim 8, wherein the electrical contacts are arranged in pairs.

12. A housing for an electrical connector, the housing comprising:

a first group of apertures that are disposed in a substantially linear alignment in a first direction, and that are each for receiving a contact;

a second group of apertures that are disposed in a substantially linear alignment in the first direction, and that are each not for receiving a contact;

a plurality of the apertures of the second group of apertures being disposed adjacent to more than one of the apertures of the first group; and the apertures of the second group of apertures being disposed so that one of the apertures of the first group is not adjacent to any apertures from the second group, wherein the second group of apertures are heat-transfer apertures for facilitating circulation of air through the housing.

13. The housing of claim 12, further comprising a leadframe assembly having a housing and a plurality of contacts extending therethrough, wherein each contact of the leadframe assembly is positioned within a respective aperture of the first group of apertures.

14. The housing of claim 12, further comprising a third group of apertures that are disposed in a substantially linear alignment in the first direction and that are each for receiving a contact, wherein only the housing body is disposed between at least one of the apertures of the first group and at least one of the apertures of the third group.

15. The housing of claim 12, further comprising a plurality of contacts, wherein each contact extends through a respective aperture of the first group of apertures.

16. The housing of claim 15, wherein the contacts are arranged in pairs.

17. The housing of claim 12, wherein the second group of apertures is spaced from the first group of apertures along a second direction that is different from the first direction.

18. The housing of claim 17, wherein the second direction is perpendicular with respect to the first direction.

19. An electrical connector, comprising: a housing including a body, the body defining a first column of apertures extending therethrough, and a second column of apertures extending therethrough, in substantially the same direction as the first column of apertures, wherein (i) a first electrically insulative frame carries a first column of electrical contact, and the contacts in the first column of contacts are disposed in respective apertures of the first column of apertures, (ii) each aperture of the second column of apertures does not contain an electrical contact, (iii) a first aperture of the first column of apertures is spaced apart from an adjacent aperture of the first column of apertures by a first distance, (iv) a first aperture of the second column of apertures is spaced apart from an adjacent aperture of the second column of apertures by a second distance, (v) the second distance is greater than the first distance, and (vi) a second electrically insulative frame carries a second column of electrical contacts, such that the first and second electrically insulative frames define a passage therebetween that is fluidly connected to the apertures of the second column of apertures.

20. The electrical connector of claim 19, wherein the passage is defined by a mounting face of the housing.

21. The electrical connector of claim 19, wherein the apertures of the second column of aperture extends substantially in a first direction, and the passage extends substantially in a second direction perpendicular to the first direction.

22. A housing for an electrical connector, the housing comprising:

a first group of apertures that are disposed in a substantially linear alignment in a first direction;

a leadframe assembly having a housing and a plurality of contacts extending therethrough, wherein each contact of the leadframe assembly is positioned within a respective aperture of the first group of apertures;

a second group of apertures that are disposed in a substantially linear alignment in the first direction, and that are each not for receiving a contact;

a plurality of the apertures of the second group of apertures being disposed adjacent to more than one of the apertures of the first group; and the apertures of the second group of apertures being disposed so that one of the apertures of the first group is not adjacent to any apertures from the second group.

23. A housing for an electrical connector, the housing comprising:

a first group of apertures that are disposed in a substantially linear alignment in a first direction, and that are each for receiving a contact;

a second group of apertures that are disposed in a substantially linear alignment in the first direction, and that are each not for receiving a contact, the apertures of the second group of apertures being disposed so that one of the apertures of the first group is not adjacent to any apertures from the second group, wherein a plurality of the apertures of the second group of apertures are disposed adjacent to more than one of the apertures of the first group; and a third group of apertures that are disposed in a substantially linear alignment in the first direction and that are each for receiving a contact, wherein only the housing body is disposed between an aperture of the first group and an aperture of the third group.

24. The housing of claim 23, further comprising a leadframe assembly having a housing and a plurality of contacts extending therethrough, wherein each contact of the leadframe assembly is positioned within a respective aperture of the first group of apertures.

25. An electrical connector comprising:

a housing having a first column of electrical contact-containing apertures through the housing, the first column extending along a first direction, a second column of electrical contact-containing apertures extending through the housing, the second column spaced from the first column and extending along the first direction, and a third column of apertures that do not contain electrical contacts, the third column disposed between the first and second columns of electrical contact-containing apertures, such that an aperture of the third column of apertures is aligned with an aperture of the first column of electrical contact-receiving apertures with respect to a second direction that extends perpendicular to the first direction, and further aligned with an aperture of the second column of electrical contact-receiving apertures with respect to a second direction that extends perpendicular to the first direction; and a plurality of electrical contacts, each electrical contact being disposed in a respective aperture of the first and second columns of apertures.

26. The electrical connector of claim 25, further comprising a first electrically-insulative frame carrying a first plurality of the electrical contacts, each of the first plurality of electrical contacts being disposed in a respective aperture of the first column of apertures, and a second electrically-insulative frame disposed adjacent the first electrically insulative frame, wherein the second electrically-insulative frame carries a second plurality of the electrical contacts, each of the second plurality of electrical contacts being disposed in a respective aperture of the second column of apertures, wherein the frames define a passage therebetween that is fluidly connected to the apertures of the third column of apertures.

27. The electrical connector of claim 25, wherein the apertures of the third column are heat transfer apertures.

28. The electrical connector of claim 25, further comprising a passage that connects a first aperture of the third column of apertures with a second aperture of the third column of apertures.

29. The electrical connector of claim 28, wherein the no additional apertures of the third column of apertures is disposed between the first and second apertures of the third column of apertures along the first direction.

30. The electrical connector of claim 25, wherein a plurality of apertures of the third column of apertures is aligned with a corresponding plurality of apertures of the first column of electrical contact-receiving apertures with respect to a second direction that extends perpendicular to the first direction, and further aligned with a corresponding plurality of apertures of the second column of electrical contact-receiving apertures with respect to a second direction that extends perpendicular to the first direction.

31. The electrical connector of claim 30, further comprising a passage that connects a first aperture of the third column of apertures with a second aperture of the third column of apertures.

* * * * *